United States Patent
Manea et al.

(10) Patent No.: US 8,885,413 B2
(45) Date of Patent: Nov. 11, 2014

(54) ADAPTIVE PROGRAMMING FOR NON-VOLATILE MEMORY DEVICES

(75) Inventors: Danut Manea, Saratoga, CA (US);
Erwin Castillon, Milpitas, CA (US);
Uday Mudumba, San Jose, CA (US);
Sabina Centazzo, Sunnyvale, CA (US);
Stephen Trinh, San Jose, CA (US);
Dixie Nguyen, San Jose, CA (US)

(73) Assignee: Atmel Corporation, San Jose, CA (US)

(*) Notice: Subject to any disclaimer, the term of this patent is extended or adjusted under 35 U.S.C. 154(b) by 304 days.

(21) Appl. No.: 13/425,203

(22) Filed: Mar. 20, 2012

(65) Prior Publication Data
US 2013/0250692 A1 Sep. 26, 2013

(51) Int. Cl.
*G11C 11/34* (2006.01)
(52) U.S. Cl.
USPC .............................. 365/185.18; 365/185.22
(58) Field of Classification Search
CPC ..... G11C 16/10; G11C 11/5628; G11C 5/147
USPC ........................ 365/185.18, 185.22
See application file for complete search history.

(56) References Cited

U.S. PATENT DOCUMENTS 8,369,152 B2* 2/2013 Shimane et al. ......... 365/185.18

* cited by examiner

*Primary Examiner* — Son Dinh
*Assistant Examiner* — Nam Nguyen
(74) *Attorney, Agent, or Firm* — Fish & Richardson P.C.

(57) ABSTRACT

Systems and techniques for performing write operations on non-volatile memory are described. A described system includes a memory structure including non-volatile memory cells that are arranged on word lines and bit lines and a microcontroller that is communicatively coupled with the memory structure. The memory structure can include non-volatile memory cells that are arranged on word lines and bit lines. The microcontroller can be configured to receive data to write to the memory structure, write the data to the memory structure using a selected word line of the word lines, detect a failure to write the data, apply, based on the failure, a negative bias voltage to one or more unselected word lines of the word lines during a negative bias period, and write the data to the portion of the memory cells using the selected word line during the negative bias period.

14 Claims, 6 Drawing Sheets

ADAPTIVE PROGRAMMING FOR NON-VOLATILE MEMORY DEVICES

TECHNICAL FIELD

This patent document relates generally to non-volatile memory and write operations thereto.

BACKGROUND

Computer systems use memory modules for storing and retrieving data. Memory modules can include non-volatile memory cells such as flash memory cells. Flash memory, for example, stores information in a lattice of memory cells each having floating-gate transistors. Memory cells can be arranged into arrays and accessed by word lines and bit lines, with memory cells in a row sharing the same word line, while memory cells in a column share the same bit line. During a memory operation, a selected word line is held at a supply voltage, while unselected word lines are grounded. A selected bit line is used to access a specific memory cell on the selected word line during the memory operation. Multiple bit lines can be selected, either concurrently or sequentially, during the memory operation to access multiple cells on the selected word line.

SUMMARY

This document describes, among other things, technologies relating to non-volatile memory architectures. In one aspect, a described architecture includes a memory structure including non-volatile memory cells that are arranged on word lines and bit lines and a microcontroller that is communicatively coupled with the memory structure. The memory structure can include non-volatile memory cells that are arranged on word lines and bit lines. The microcontroller can be configured to receive data to write to the memory structure, write the data to the memory structure using a selected word line of the word lines, detect a failure to write the data, apply, based on the failure, a negative bias voltage to one or more unselected word lines of the word lines during a negative bias period, and write the data to the portion of the memory cells using the selected word line during the negative bias period.

This and other implementations can include one or more of the following features. A failure can be based on two or more mismatches between the data and two or more read back versions of the data corresponding to two or more attempts to write the data to the memory structure. The microcontroller can be configured to apply a first voltage to the selected word lines for the two or more attempts and apply a second voltage to the one or more unselected word lines for the two or more attempts. The second voltage can be less than the first voltage, and the negative bias voltage can be less than the second voltage. The second voltage can be a ground voltage. The microcontroller can be configured to send a failure indication to a component responsible for providing the data to the microcontroller based on a failure to write the data to the memory structure using the selected word line during the negative bias period. In some implementations, the negative bias voltage is equal to or less than −0.5 volts and is not less than −3 volts. The memory cells can be flash memory cells. In some implementations, the memory structure and the microcontroller are integrated on a single integrated circuit.

In another aspect, a system can include a memory module and a memory controller that is communicatively coupled with the memory structure. The memory module can include a microcontroller and non-volatile memory cells that are arranged on word lines and bit lines. The memory controller can be configured to provide data to the memory module for storage. The microcontroller can be configured to write the data to the a portion of the memory cells using a selected word line of the word lines, detect a failure to write the data, apply, based on the failure, a negative bias voltage to one or more unselected word lines of the word lines, and write the data to the memory structure using the selected word line while the negative bias voltage is applied to the one or more unselected word lines. The memory controller can provide a memory address to the microcontroller. The selected word line can be selected by the microcontroller based on the memory address. The one or more unselected word lines can be the remaining ones of the word lines that are not selected based on the memory address.

In yet another aspect, an adaptive programming technique can include receiving data to write to a memory structure, writing the data to the memory structure using a selected word line of the word lines, detecting a failure to write the data, applying, based on the failure, a negative bias voltage to one or more unselected word lines of the word lines during a negative bias period, and writing, during the negative bias period, the data to the memory structure using the selected word line.

This and other techniques can include one or more of the following features. Detecting the failure can include detecting two or more mismatches between the data and two or more read back versions of the data corresponding to two or more attempts to write the data to the memory structure. The technique can include applying, for the two or more attempts, a first voltage to the selected word line. The technique can include applying, for the two or more attempts, a second voltage to the one or more unselected word lines. The second voltage can be less than the first voltage. The negative bias voltage can be less than the second voltage. The second voltage can be a ground voltage. The technique can include detecting an additional failure to write the data while applying the negative bias voltage to the one or more unselected word lines; and providing, based on the additional failure, a failure indication to a component responsible for providing the data.

Particular embodiments of the technology described in this document can be implemented so as to realize one or more of the following advantages. One or more of the described write techniques can recover a memory structure from an over-erased state such that it becomes programmable again. A write operation that selectively applies negative bias voltage can allow for faster writes during a normal state of a memory structure which does not require a negative bias voltage to successfully write data to memory cells, where the write operation can switch to applying a negative bias to compensate for when the memory structure is in an over-erased state.

The details of one or more embodiments of the subject matter described in this document are set forth in the accompanying drawings and the description below. Other features, aspects, and advantages of the subject matter will become apparent from the description, the drawings, and the claims.

BRIEF DESCRIPTION OF THE DRAWINGS

Like reference numbers and designations in the various drawings indicate like elements.

DETAILED DESCRIPTION

Non-volatile memory such as flash memory can store data representing logical ones and logical zeros, and retain the data without power. A memory structure can include non-volatile memory cells that are arranged on word lines and bit lines. An erase operation can write logical ones to at least a portion of a memory structure, such as all of the cells on a word line. After an erase operation, a write operation includes writing data to a portion of cells of the memory structure by selectively programming the cells, e.g., converting one or more logical ones to logical zeros, such that the affected memory cells match the data.

Fowler-Nordheim tunneling effect of metal-oxide-semiconductor (MOS) transistors can be used to erase a flash memory cell; note that there can be a very small or no charge on the floating gate of a flash cell, thus having low threshold voltage. The Hot Electron Injection effect can be used to program a flash cells by trapping electrons on the floating gate of the flash cell. Trapping electrons increases the threshold voltage of the flash cell. To have high channel current during programming, big positive voltages (e.g., 10 volts or 20 volts) are applied to a flash cell's gate via a word line, the cell's drain via a bit line, or both.

Typically, based on a flash memory architecture, an erase operation erases all the cells on the same word line. In some implementations, multiple word lines can be erased simultaneously to increase the speed of an erase operation. In contrast, a programming operation individually affects one or more cells. Based on an erase operation erasing all of the cells on a word line, the erase operation may result in some cells becoming over-erased because the erase operation does not stop until it erases every cell on the word line—some cells are slower to erase than others. Over-erased cells may cause leakage currents. The erase operation can be followed by a recovery operation to recover the cells from an over-erase state. However, due to an unexpected event, such as a premature shutdown or device eject, the recovery operation may not fully complete or even start.

Unrecovered memory cells may jeopardize programming operations because these cells may cause a sufficient amount of current leakage during a programming operation such that none of the cells on a word line can be programmed. Further, during a programming operation, a drain pump supplying the bit line voltage can experience a high channel current through the cell that has to be programmed and leakage currents through unrecovered memory cells that are connected to the same bit line. If the combined current is high enough, the drain pump can collapse, i.e., where the output voltage of the drain pump goes to around zero volts, which makes the programming capability of the memory device inoperable.

A memory device can employ an adaptive programming routine to compensate for unrecovered cells during a programming operation. The routine can mask over-erased cells during a programming operation by using negative bias voltage on unselected word lines to eliminate leakage currents through cells on unselected word lines. The adaptive programming routine initially attempts to write data to a cell for a predetermined number of attempts without using a negative bias voltage. If the write fails after the predetermined number of attempts, the routine applies the negative bias voltage on unselected word lines and continue programming the cell on the selected word line.

Figure 1:
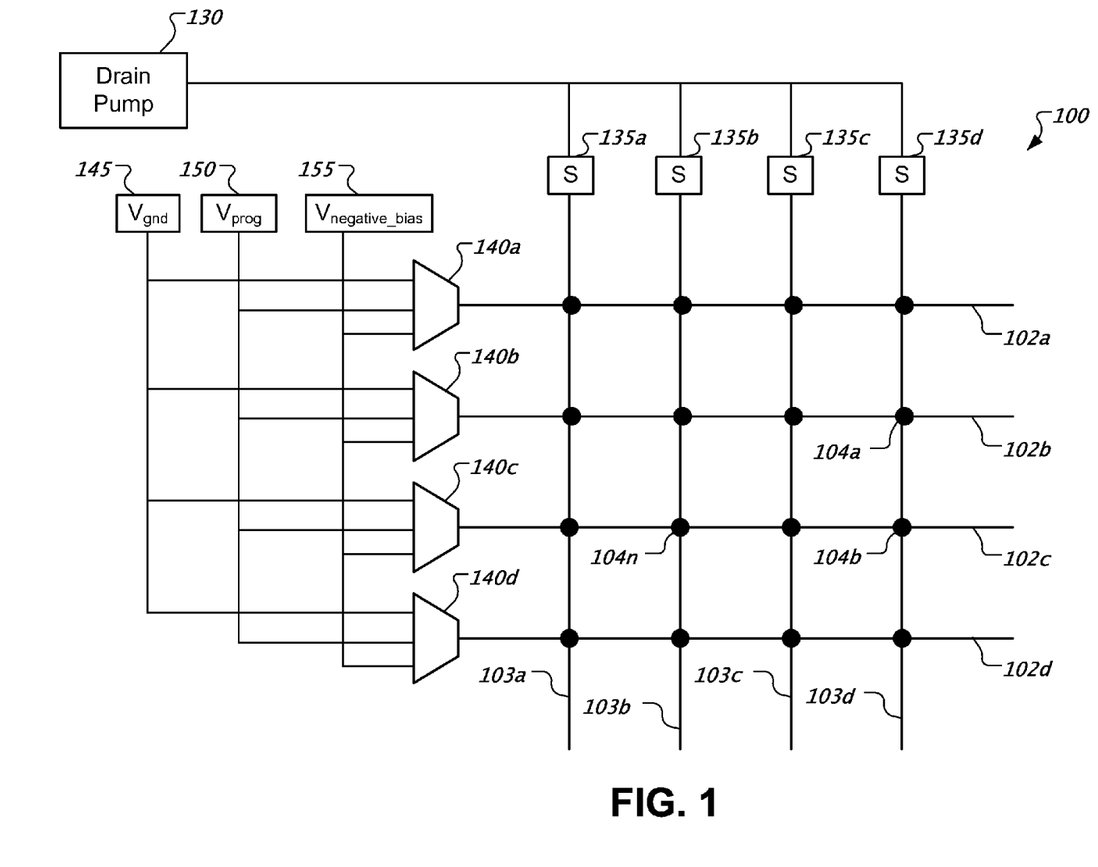
FIG. 1 shows a schematic diagram of an example architecture of a flash memory device.

FIG. 1 shows a schematic diagram of an example architecture of a flash memory device 100. The flash memory device 100 includes memory cells 104a-n arranged in a two-dimensional lattice. Other arrangements are possible. Different charge states associated with a cell 104a-n, such as charged or uncharged, can represent different logical values, such as a logical one or a logical zero. The bit lines 103a-d and word lines 102a-d can be used to address an individual cell 104a-n for programming and reading operations.

The memory device 100 can selectively apply different voltages to the word lines 102a-d throughout its operations. A ground voltage interface 145 provides a ground voltage. A programming voltage interface 150 provides a programming voltage. A negative bias voltage interface 155 provides a negative bias voltage. Multiplexers 140a-d control the application of these voltages to respective word lines 102a-d. A microcontroller (not shown) can individually control the multiplexers 140a-d to select voltage interfaces 145, 150, 155 for each of the word lines 102a-d. The drain pump 130 applies a voltage to a group of switches 135a-d that control the flow of current for the bit lines 103a-d, respectively. The microcontroller can control the switches 135a-d. By activating a switch 135a-d correspond to a selected bit line of the bit lines 103a-d and applying a programming voltage to a selected word line of the word lines 102a-d via the programming voltage interface 150 and a multiplexer 140a-d, the corresponding cell at the intersection of the selected lines can be programmed. The unselected word lines can be held a ground voltage via the ground voltage interface 145 and corresponding multiplexers 140a-d.

Figure 2:
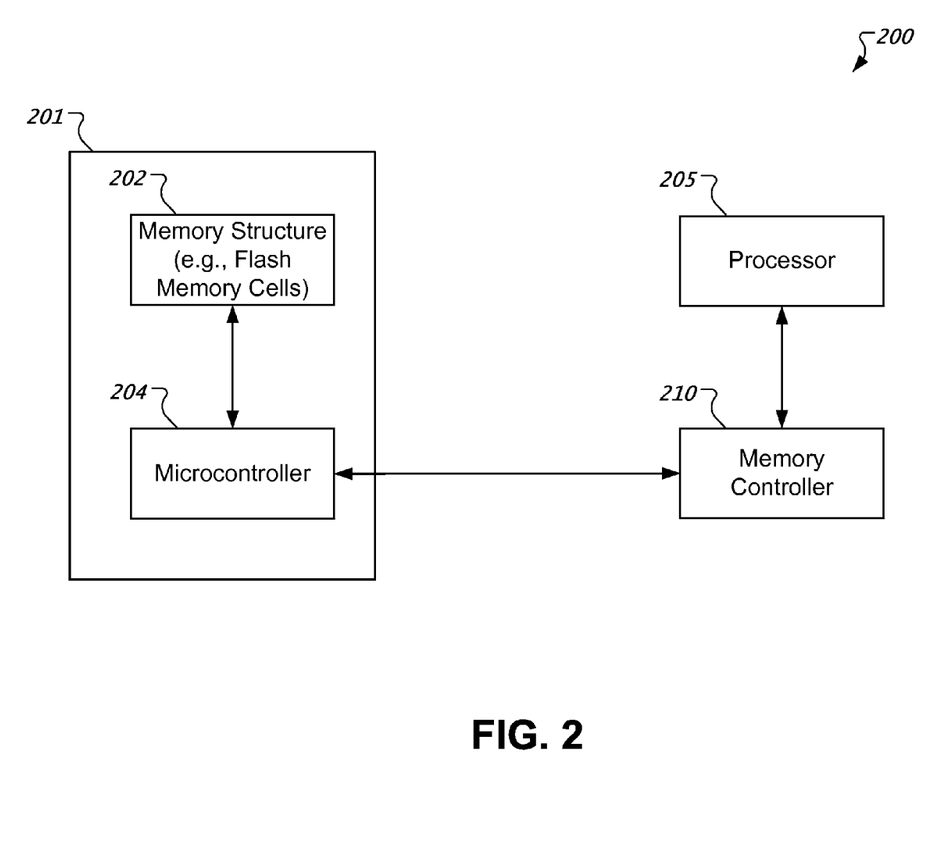
FIG. 2 shows a schematic diagram of an example architecture of a data processing apparatus.

FIG. 2 shows a schematic diagram of an example architecture of a data processing apparatus 200. The data processing apparatus 200 includes a memory module 201, a processor 205, and a memory controller 210. In some implementations, the processor 205 resides on a first integrated circuit and the memory controller 210 resides on a second integrated circuit. The memory module 201 includes a microcontroller 204 and a memory structure 202. The memory structure 202 includes non-volatile memory cells such as flash memory cells. The memory module 201 can be implemented on a single integrated circuit. The memory controller 210 is communicatively coupled with the microcontroller 204. The microcontroller 204 can be configured to receive data to write to the memory structure 202 from a component such a memory controller 210, write the data to the memory structure 202 using a selected word line, and based on a failure to write the data, apply a negative bias voltage to one or more unselected word lines while writing the data to the memory structure 202 using the selected word line. The process of selectively applying negative bias during a write operation can be transparent to components external to the memory module 201 such as the memory controller 210.

Figure 3:
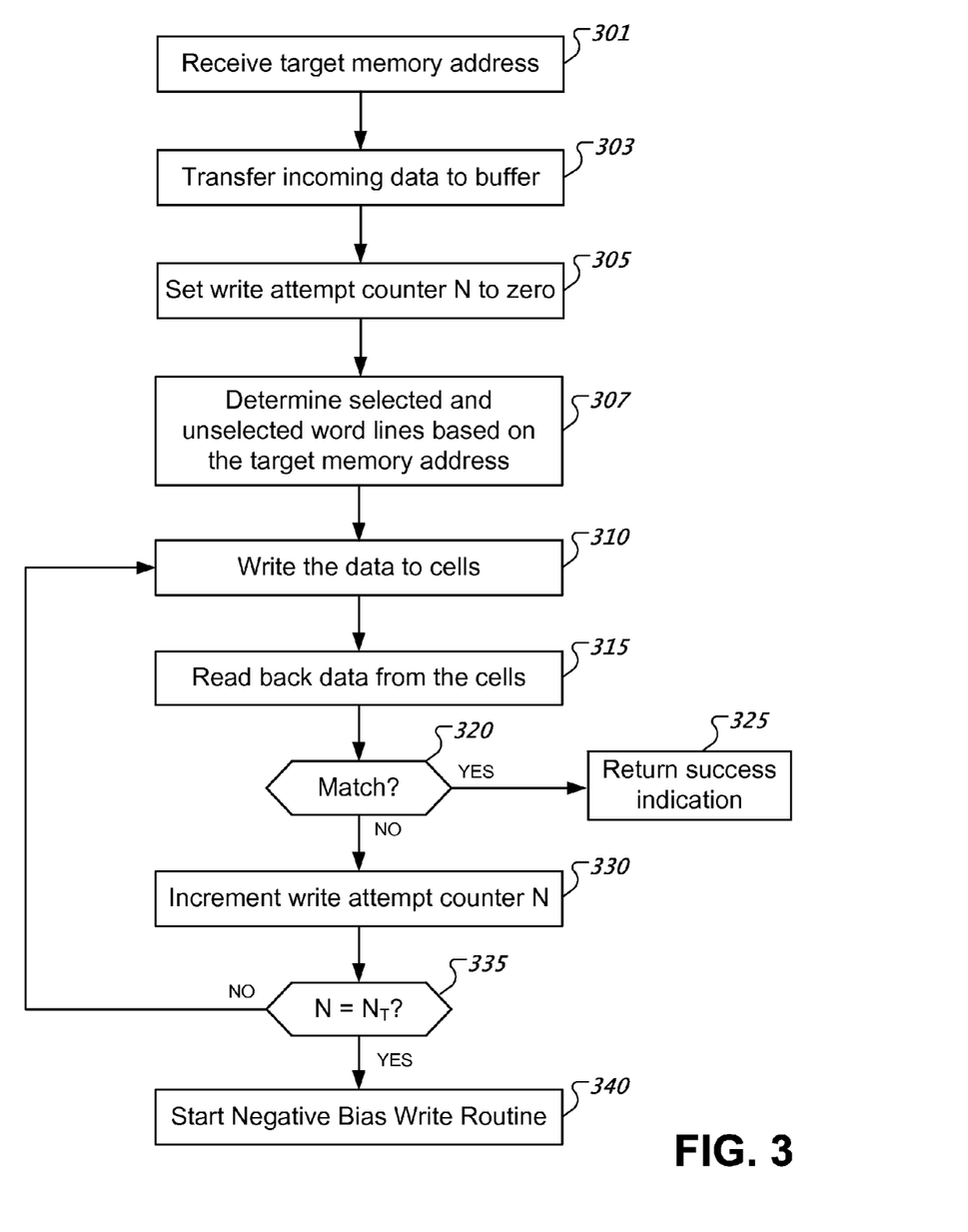
FIG. 3 shows a flowchart of an example process for writing data to memory cells of a memory structure.

FIG. 3 shows a flowchart of an example process for writing data to memory cells of a memory structure. The process can be performed by a microcontroller communicatively coupled with the memory structure. At 301, the microcontroller receives a target memory address that is associated with incoming data. At 303, the microcontroller transfers the incoming data to a buffer. Transferring data to a buffer can include writing the data to a register included in the buffer. At 305, the microcontroller sets a write attempt counter N to zero. At 307, the microcontroller determines selected and unselected word lines based on the target memory address. A word line can be selected based on the target memory address.

The unselected word lines can be the remaining word lines that are not selected based on the target memory address.

At 310, the microcontroller writes the data to the cells. Writing the data to the cells can include applying a programming voltage to a selected word line and applying a ground voltage to one or more unselected word lines. The microcontroller can program one or more cells on a selected word line during a write operation. Writing the data to the cells can include operating one or more switches corresponding to one or more bit lines to access one or more memory cells that reside on the selected word line.

At 315, the microcontroller reads back data from the cells. At 320, the microcontroller determines whether there is a match. Determining whether there is a match can include comparing, bit-by-bit, the read back data with at least a portion of the data stored in the buffer. If the read back matches, then a success indication is returned at 325. If the read back does not match, then the write attempt counter N is incremented, at 330, by one. At 335, the microcontroller determines whether the write attempt counter N has exceeded a threshold value $N_T$. In some implementations, the threshold value $N_T$ is 4. Other threshold values are possible and can be selected to effect the memory's operational characteristics such as an average time for a programming operation. If the write attempt counter N is less than the threshold value $N_T$, then the microcontroller tries to write the data again to the cells at 310. If the write attempt counter N equals the threshold value $N_T$, then the microcontroller starts a negative bias write routine at 340.

Figure 4:
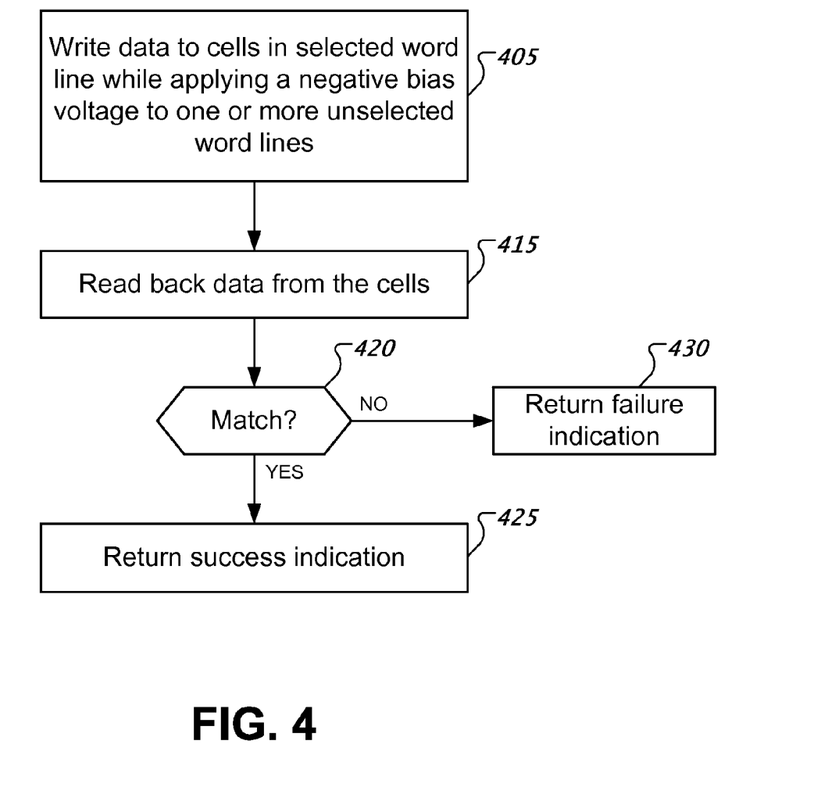
FIG. 4 shows a flowchart of an example negative bias write routine.

FIG. 4 shows a flowchart of an example negative bias write routine. At 405, a microcontroller writes data to cells in a selected word line while applying a negative bias voltage to one or more unselected word lines. At 415, the microcontroller reads back the data from the cells. At 420, the microcontroller determines whether there is a match between the data and the read back version of the data. If there is not a match, the microcontroller can return a failure indication at 430. Returning a failure indication can include sending a signal that indicates a completion of a write command with a failure code. If there is a match, the microcontroller can return a success indication at 425. Returning a success indication can include sending a signal that indicates a completion of a write command with a success code.

Figure 5:
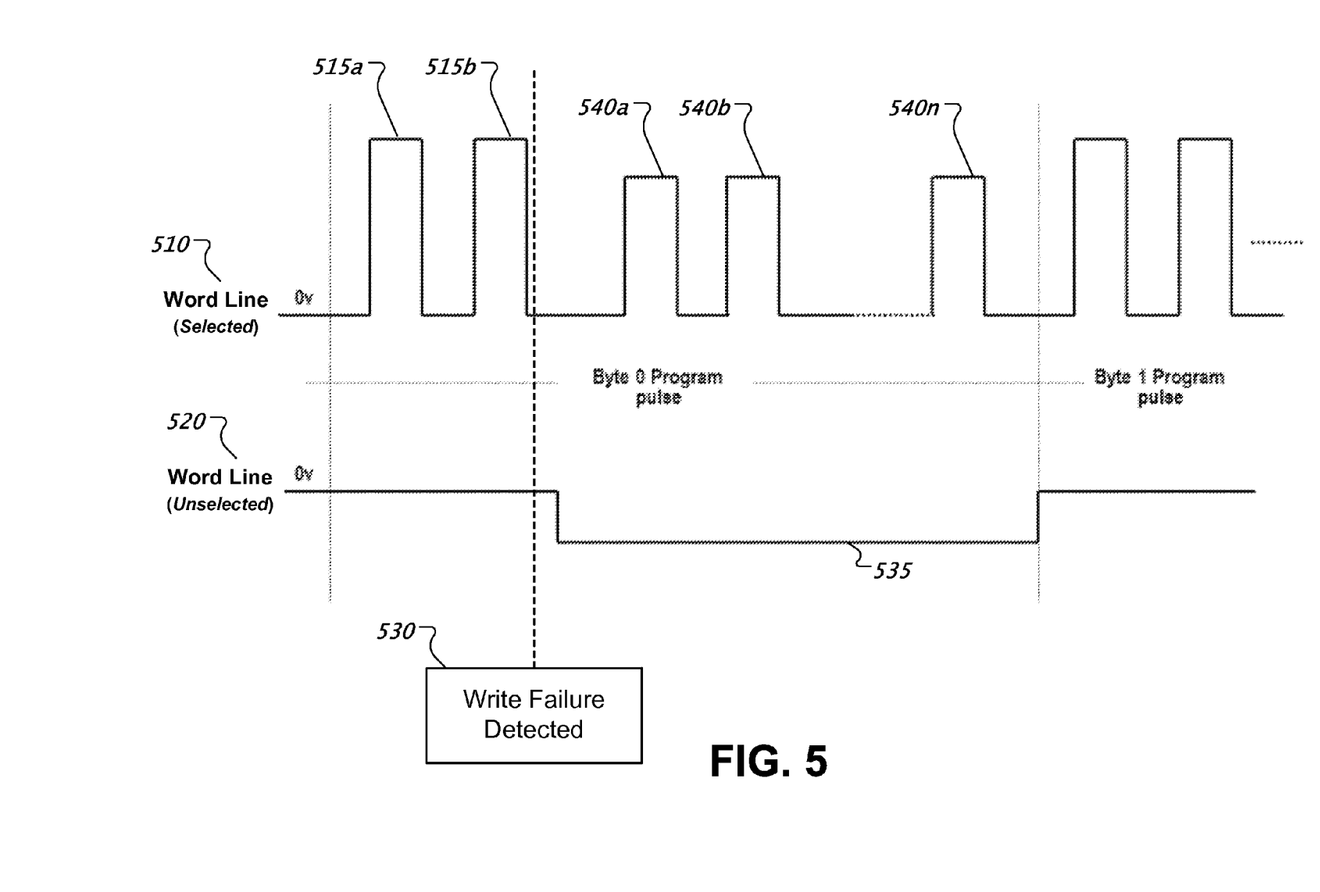
FIG. 5 shows waveforms associated with an example write process that selectively applies a negative bias voltage.

FIG. 5 shows waveforms associated with an example write process that selectively applies a negative bias voltage. A first waveform 510 shows a voltage signal associated with a selected word line. A second waveform 520 shows a voltage signal associated with an unselected word line. The microcontroller can apply a programming voltage, in one or more write pulses 515a-b, to a selected word line. In some implementations, the programming voltage is 10 volts. Other programming voltages are possible.

Based on a detection 530 of a failure to write data to one or more memory cells during the one or more write pulses 515a-b, the microcontroller can apply a negative bias voltage to one or more unselected word lines during a negative bias period 535. In some implementations, the negative bias voltage is equal to or less than −0.5 volts. In some implementations, the negative bias voltage is not less than −3 volts. During the negative bias period 535, the microcontroller applies write pulses 540a-n to program one or more cells.

Figure 6:
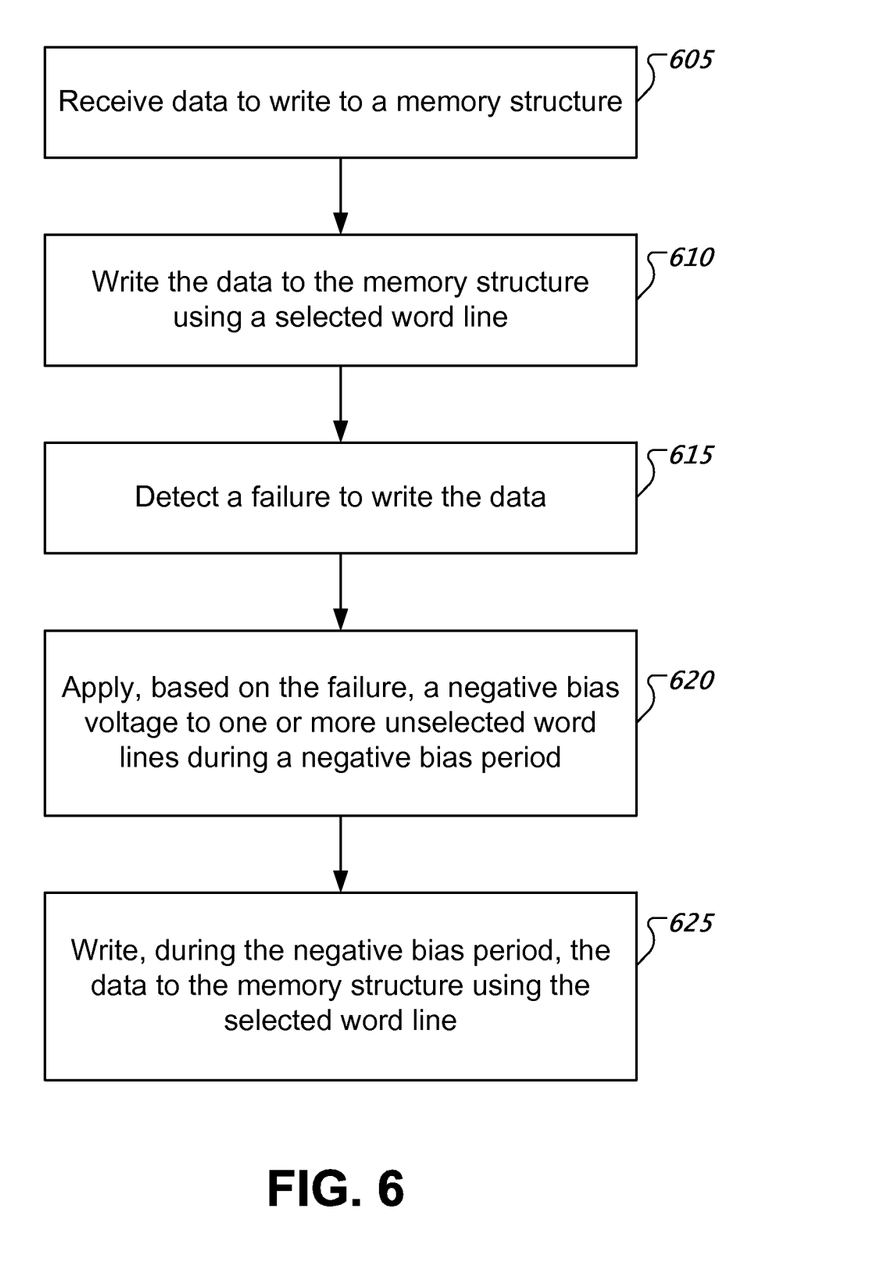
FIG. 6 shows a flowchart of an example process that includes a negative bias write operation.

FIG. 6 shows a flowchart of an example process that includes a negative bias write operation. At 605, the process includes receiving data to write to a memory structure. The memory structure can include non-volatile memory cells that are arranged on word lines and bit lines. Receiving the data can include transferring the data to an internal buffer. The process can include receiving a memory address in conjunction with receiving the data. At 610, the process includes writing the data to the memory structure using a selected word line. Writing the data to the memory structure can include selecting a word line based on a memory address. Writing the data can include applying programming voltage to the word line and holding the remaining, unselected word lines at a ground voltage.

At 615, the process includes detecting a failure to write the data. Detecting the failure can include detecting two or more mismatches between the data and two or more read back versions of the data corresponding to two or more attempts to write the data to the memory structure. Detecting a mismatch can include comparing at least a portion of a write buffer with a read back buffer. The process can read data from memory structure using the memory address and store the read data into the read back buffer.

At 620, the process includes applying, based on the failure, a negative bias voltage to one or more unselected word lines during a negative bias period. At 625, the process includes writing, during the negative bias period, the data to the memory structure using the selected word line. Based on a success, the process can return a success indication to a component responsible for providing the data. However, upon detecting an additional failure to write the data while applying the negative bias voltage to the one or more unselected word lines, the process can return a failure indication to the component responsible for providing the data.

While this document contains many specific implementation details, these should not be construed as limitations on the scope of any inventions or of what may be claimed, but rather as descriptions of features specific to particular embodiments of particular inventions. Certain features that are described in this document in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

What is claimed is:

1. An apparatus comprising:
a memory structure comprising non-volatile memory cells that are arranged on word lines and bit lines; and
a microcontroller that is communicatively coupled with the memory structure, the microcontroller configured to receive data to write to the memory structure, write the data to the memory structure using a selected word line of the word lines, detect a failure to write the data, apply, based on the failure, a negative bias voltage to one or more unselected word lines of the word lines during a negative bias period, and write the data to the portion of the memory cells using the selected word line during the negative bias period;
wherein the failure is based on two or more mismatches between the data and two or more read back versions of the data corresponding to two or more attempts to write the data to the memory structure; and
wherein the microcontroller is configured to apply a first voltage to the selected word lines for the two or more attempts and apply a second voltage to the one or more unselected word lines for the two or more attempts, wherein the second voltage is less than the first voltage, and wherein the negative bias voltage is less than the second voltage.

2. The apparatus of claim 1, wherein the second voltage is a ground voltage.

3. The apparatus of claim 1, wherein the microcontroller is configured to send a failure indication to a component responsible for providing the data to the microcontroller based on a failure to write the data to the memory structure using the selected word line during the negative bias period.

4. The apparatus of claim 1, wherein the negative bias voltage is equal to or less than −0.5 volts and is not less than −3 volts.

5. The apparatus of claim 1, wherein the memory cells are flash memory cells.

6. The apparatus of claim 1, wherein the memory structure and the microcontroller are integrated on a single integrated circuit.

7. A system comprising:
a memory module comprising a microcontroller and non-volatile memory cells that are arranged on word lines and bit lines; and
a memory controller that is communicatively coupled with the memory structure, the memory controller configured to provide data to the memory module for storage,
wherein the microcontroller is configured to write the data to the a portion of the memory cells using a selected word line of the word lines, detect a failure to write the data, apply, based on the failure, a negative bias voltage to one or more unselected word lines of the word lines, and write the data to the memory structure using the selected word line while the negative bias voltage is applied to the one or more unselected word lines;
wherein the failure is based on two or more mismatches between the data and two or more read back versions of the data corresponding to two or more attempts to write the data to the memory structure; and
wherein the microcontroller is configured to apply a first voltage to the selected word lines for the two or more attempts and apply a second voltage to the one or more unselected word lines for the two or more attempts, wherein the second voltage is less than the first voltage, and wherein the negative bias voltage is less than the second voltage.

8. The system of claim 7, wherein the second voltage is a ground voltage.

9. The system of claim 7, wherein the microcontroller is configured to send a failure indication to the memory controller based on a failure to write the data to the memory structure using the selected word line while the negative bias voltage is applied to the one or more unselected word lines.

10. The system of claim 7, wherein the memory cells are flash memory cells.

11. A system comprising:
a memory module comprising a microcontroller and non-volatile memory cells that are arranged on word lines and bit lines; and
a memory controller that is communicatively coupled with the memory structure, the memory controller configured to provide data to the memory module for storage,
wherein the microcontroller is configured to write the data to the a portion of the memory cells using a selected word line of the word lines, detect a failure to write the data, apply, based on the failure, a negative bias voltage to one or more unselected word lines of the word lines, and write the data to the memory structure using the selected word line while the negative bias voltage is applied to the one or more unselected word lines,
wherein the memory controller provides a memory address to the microcontroller, wherein the selected word line is selected by the microcontroller based on the memory address, and wherein the one or more unselected word lines are the remaining ones of the word lines that are not selected based on the memory address.

12. A method comprising:
receiving data to write to a memory structure, the memory structure comprising non-volatile memory cells that are arranged on word lines and bit lines;
writing the data to the memory structure using a selected word line of the word lines;
detecting a failure to write the data, wherein detecting the failure comprises detecting two or more mismatches between the data and two or more read back versions of the data corresponding to two or more attempts to write the data to the memory structure;
applying, based on the failure, a negative bias voltage to one or more unselected word lines of the word lines during a negative bias period;
applying, for the two or more attempts, a first voltage to the selected word line;
applying, for the two or more attempts, a second voltage to the one or more unselected word lines, wherein the second voltage is less than the first voltage, wherein the negative bias voltage is less than the second voltage; and
writing, during the negative bias period, the data to the memory structure using the selected word line.

13. The method of claim 12, wherein the second voltage is a ground voltage.

14. The method of claim 12, further comprising:
detecting an additional failure to write the data while applying the negative bias voltage to the one or more unselected word lines; and
providing, based on the additional failure, a failure indication to a component responsible for providing the data.

* * * * *

UNITED STATES PATENT AND TRADEMARK OFFICE
CERTIFICATE OF CORRECTION

PATENT NO. : 8,885,413 B2  
APPLICATION NO. : 13/425203  
DATED : November 11, 2014  
INVENTOR(S) : Danut Manea et al.

Page 1 of 1

It is certified that error appears in the above-identified patent and that said Letters Patent is hereby corrected as shown below:

In the Specification

Col. 2, line 4, after "to the" delete "a".

In the Claims

Col. 7, line 27, Claim 7, after "to the" delete "a".

Col. 8, line 9, Claim 11, after "to the" delete "a".

Signed and Sealed this  
Twelfth Day of May, 2015

Michelle K. Lee  
*Director of the United States Patent and Trademark Office*